(12) United States Patent
Hayashi

(10) Patent No.: US 9,912,123 B2
(45) Date of Patent: Mar. 6, 2018

(54) SEMICONDUCTOR LIGHT EMITTING DEVICE

(71) Applicant: Nichia Corporation, Anan-shi (JP)

(72) Inventor: Seiichi Hayashi, Anan (JP)

(73) Assignee: NICHIA CORPORATION, Anan-Shi (JP)

( * ) Notice: Subject to any disclaimer, the term of this patent is extended or adjusted under 35 U.S.C. 154(b) by 14 days.

(21) Appl. No.: 14/466,708

(22) Filed: Aug. 22, 2014

(65) Prior Publication Data

US 2015/0053917 A1  Feb. 26, 2015

(30) Foreign Application Priority Data

Aug. 24, 2013 (JP) ................................. 2013-174035

(51) Int. Cl.

| | |
|---|---|
| *H01L 29/06* | (2006.01) |
| *H01L 31/00* | (2006.01) |
| *H01L 33/00* | (2010.01) |
| *H01S 5/343* | (2006.01) |
| *H01L 33/06* | (2010.01) |
| *H01L 33/32* | (2010.01) |
| *H01S 5/34* | (2006.01) |

(52) U.S. Cl.
CPC .......... *H01S 5/34333* (2013.01); *H01L 33/06* (2013.01); *H01L 33/32* (2013.01); *H01S 5/3408* (2013.01)

(58) Field of Classification Search
CPC . H01S 5/34; H01L 33/00; H01L 33/06; H01L 33/08; H01L 33/12; H01L 33/40
USPC ......... 257/9–14, 76, 101, E33.005, E33.008, 257/E33.012, E33.033, E33.034; 438/37, 438/46, 47
See application file for complete search history.

(56) References Cited

U.S. PATENT DOCUMENTS

| | | |
|---|---|---|
| 8,575,593 B2 | 11/2013 | Han et al. |
| 2003/0020085 A1 | 1/2003 | Bour et al. |

(Continued)

FOREIGN PATENT DOCUMENTS

| | | |
|---|---|---|
| JP | H11-026812 A | 1/1999 |
| JP | 2003-060232 A | 2/2003 |

(Continued)

OTHER PUBLICATIONS

Notification of Reason(s) for Refusal issued in Japanese Patent Application No. 2013-174035 mailed Dec. 7, 2016.

*Primary Examiner* — Sheikh Maruf
(74) *Attorney, Agent, or Firm* — Foley & Lardner LLP

(57) ABSTRACT

A semiconductor light emitting device is provided which has improved light emission efficiency. The semiconductor light emitting device includes an active layer having a quantum well structure. The quantum well structure includes well and barrier layers that are alternately and repeatedly deposited on one another. The well layer is formed of a gallium nitride group semiconductor that contains In. The well layer has a profile of composition ratio of In that includes a first portion, and a second portion that is in contact with the first portion. The concentration of In in the first portion is substantially fixed or reduced along the thickness direction of the well layer from the negative side to the positive side of the piezoelectric field that is produced in the well layer. The concentration of In in the second portion is sharply reduced with respect to the first portion.

17 Claims, 9 Drawing Sheets

(56) References Cited

U.S. PATENT DOCUMENTS

| | | | |
|---|---|---|---|
| 2004/0256611 A1* | 12/2004 | Kim | B82Y 20/00 257/13 |
| 2007/0045638 A1 | 3/2007 | Shen et al. | |
| 2008/0273566 A1* | 11/2008 | Nishinaka | H01L 33/32 372/45.012 |
| 2008/0283822 A1* | 11/2008 | Yui | H01L 33/06 257/13 |
| 2008/0315180 A1* | 12/2008 | Kim | H01L 33/06 257/13 |
| 2009/0090901 A1* | 4/2009 | Kim | H01L 33/12 257/13 |
| 2009/0101934 A1* | 4/2009 | Massies et al. | 257/103 |
| 2009/0224226 A1* | 9/2009 | Huang | H01L 33/06 257/13 |
| 2010/0032646 A1* | 2/2010 | Tanaka | B82Y 20/00 257/13 |
| 2010/0059734 A1* | 3/2010 | Kaneko et al. | 257/13 |
| 2011/0133156 A1* | 6/2011 | Won | H01L 33/06 257/13 |
| 2011/0198583 A1* | 8/2011 | Nago | B82Y 20/00 257/43 |
| 2011/0204328 A1* | 8/2011 | Tansu | H01L 33/32 257/14 |
| 2012/0007113 A1* | 1/2012 | Hwang | H01L 33/06 257/94 |
| 2012/0056157 A1* | 3/2012 | Hikosaka | B82Y 20/00 257/13 |
| 2012/0138889 A1* | 6/2012 | Tachibana | H01L 33/32 257/13 |
| 2012/0138890 A1* | 6/2012 | Shioda | H01L 33/40 257/13 |
| 2013/0020553 A1* | 1/2013 | Han | H01L 33/06 257/13 |
| 2013/0026446 A1* | 1/2013 | Han | H01L 33/32 257/13 |
| 2013/0028281 A1 | 1/2013 | Avramescu et al. | |
| 2013/0087761 A1* | 4/2013 | Kimura | H01L 33/12 257/13 |
| 2013/0126898 A1 | 5/2013 | Kato et al. | |
| 2013/0228806 A1* | 9/2013 | Wang et al. | 257/94 |
| 2014/0077152 A1* | 3/2014 | Li | H01L 33/32 257/13 |
| 2014/0077153 A1* | 3/2014 | Li | H01S 5/34333 257/13 |
| 2014/0346437 A1* | 11/2014 | Sim | H01L 33/06 257/13 |
| 2014/0374700 A1* | 12/2014 | Li | H01L 33/145 257/13 |
| 2015/0108426 A1* | 4/2015 | Hertkorn | H01L 33/06 257/13 |
| 2015/0280059 A1* | 10/2015 | Kang | H01L 33/06 257/13 |
| 2016/0118539 A1* | 4/2016 | Sugiyama | H01L 21/0242 257/13 |
| 2016/0126411 A1* | 5/2016 | Saito | H01L 33/06 257/13 |

FOREIGN PATENT DOCUMENTS

| | | |
|---|---|---|
| JP | 2003-234545 A | 8/2003 |
| JP | 2005-056973 A | 3/2005 |
| JP | 2007-067418 A | 3/2007 |
| JP | 2008-235606 A | 10/2008 |
| JP | 2008-288397 A | 11/2008 |
| JP | 2012-119560 A | 6/2012 |
| JP | 2012-522390 A | 9/2012 |
| WO | WO-2012/098850 A1 | 7/2012 |

* cited by examiner

SEMICONDUCTOR LIGHT EMITTING DEVICE

CROSS-REFERENCE TO RELATED APPLICATIONS

This application claims priority to Japanese Patent Application No. 2013-174035, filed on Aug. 24, 2013, which is hereby incorporated by reference in its entirety.

BACKGROUND OF THE INVENTION

1. Technical Field

The present disclosure relates to a semiconductor light emitting device, and in particular to a semiconductor light emitting device that includes a quantum well active layer.

2. Description of Related Art

Semiconductor light emitting devices such as light emitting diode (LED) and laser diode (LD) are typically and widely used for various light sources for backlighting, lighting fixtures, traffic lights, large-size displays, and the like. In particular, a light emitting device that includes gallium nitride group (GaN group) compound semiconductor is used as short wavelength light emitting device.

This type of semiconductor light emitting device can include an n-type semiconductor layer, which is deposited on or above a substrate, and a p-type semiconductor layer, which is deposited after the n-type semiconductor layer is deposited. In addition, an active layer is interposed between the n-type and p-type semiconductor layers. In order to improve light emission efficiency, the active layer has a quantum well structure in which a plurality of well layers and a plurality of barrier layers are alternately deposited on one another. For example, in the case where the well and barrier layers are formed of InGaN and GaN, respectively, piezoelectric polarization is produced by the lattice constant difference at the boundary between the well and barrier layers. It is known that the piezoelectric polarization produces the piezoelectric field, which causes distortion of the band gap.

FIG. 8 shows the profile of composition ratio of In along the deposition direction of InGaN well layers 20 and GaN barrier layers 22 where the concentration of In is fixed. FIG. 9 shows the band profile of the active layer having this profile of composition ratio of In where the piezoelectric field does not produce the distortion of the band gaps, while FIG. 10 shows the band profile of the active layer where the piezoelectric field produces the distortion of the band gaps. In the case where the piezoelectric field produces the distortion of the band gaps, the positive polarization charge will be produced on the side opposite to the substrate side of each of the well layers 20, while the negative polarization charge will be produced on the substrate side of each of the well layers 20.

Due to the polarization charge, the energy of the conduction band and the valence band of each of the well layers 20 becomes higher on the substrate side, and becomes lower on the side opposite to the substrate. The electrons collect on the side opposite to substrate side of each of the well layers 20, while the positive holes collect on the substrate side of each of the well layers 20. Since the electrons and the positive holes are located apart from each other, the wave function of electrons shifts to one side, while the wave function of positive holes shifts to another side. Accordingly, the recombination probability will be reduced between the electrons and the positive holes.

To address this, it can be conceived that the well layer is constructed to have a gradient composition ratio of In along the deposition thickness direction. JP 2003-60232 A and 2005-56973 A disclose that the concentration of In is linearly reduced from the substrate side to the side opposite to the substrate. FIG. 11 shows the profile of composition ratio of In (lower side) and the band profile (upper side) in the linearly reduced concentration of In.

(See also JP H11-026812 A and JP 2008-288397 A.)

In this case, the electrons will be uniformly located in the conduction band 23 of the well layer 20 that is flat in the thickness direction. However, the positive holes will collect around the peak 24 of the valence band on the substrate side. For this reason, the probability of Auger recombination will be increased in which no light is emitted. Also, the recombination probability of the electrons and the positive holes will be reduced. In addition, in the case where the positive holes collect around the peak 24 of the valence band of each of the well layers 20, the tunneling distance D is increased in which the positive holes are required to move between the well layers 20 adjacent to each other through the tunnel effect. Accordingly, there is a problem that the carrier mobility is reduced.

The present invention is aimed at solving the problem. It is an object of the present invention to provide a semiconductor light emitting device having improves light emission efficiency.

SUMMARY OF THE INVENTION

To achieve the above object, a semiconductor light emitting device according to one aspect of the present invention includes an active layer having a quantum well structure. The quantum well structure includes well and barrier layers that are alternately and repeatedly deposited on one another. The well layer is formed of a gallium nitride group semiconductor that contains In. The well layer has a profile of composition ratio of In that includes a first portion, and a second portion that is in contact with the first portion. The concentration of In in the first portion is substantially fixed or reduced, and the concentration of In in the second portion is sharply reduced with respect to the first portion along the thickness direction of the well layer from the negative side to the positive side of the piezoelectric field that is produced in the well layer.

Also, a semiconductor light emitting device according to another aspect of the present invention includes an n-type semiconductor layer, an active layer having a quantum well structure, and a p-type semiconductor layer. The quantum well structure includes well and barrier layers that are alternately and repeatedly deposited on one another. The n-type semiconductor layer, the active layer and the p-type semiconductor layer are deposited on or above one another in this order. The well layer is formed of a gallium nitride group semiconductor that contains In. The well layer is formed of a gallium nitride group semiconductor that contains In. The well layer has a profile of composition ratio of In that includes a first portion, and a second portion that is in contact with the first portion. The concentration of In in the first portion is substantially fixed or reduced, and the concentration of In in the second portion is sharply reduced with respect to the first portion along the thickness direction of the well layer from the n-type semiconductor side to the p-type semiconductor side.

According to the aforementioned semiconductor light emitting device, it serves to avoid that the wave functions of electrons and positive holes move to the both sides of the well layer, and that the electrons and the positive holes are spatially located apart from each other. Therefore, the recombination probability of the electrons and the positive holes can be improved. In addition, it serves to avoid that the positive holes collect around the peak of the valence band. As a result, it facilitates to prevent increase of the probability of non-light-emission Auger recombination of the electrons and the positive holes. Also, since the well layer includes the first portion, and the second portion the In concentration of which is sharply reduced with respect to the first portion, the substantial thickness of the barrier layer, which is interposed between well layers, can be smaller on the valence band side from viewpoint of the positive holes. As a result, the tunneling distance D can be smaller in which the positive holes are required to move between the well layers through the tunnel effect. Therefore, the carrier mobility can be high.

The above and further objects of the present invention as well as the features thereof will become more apparent from the following detailed description to be made in conjunction with the accompanying drawings.

DETAILED DESCRIPTION OF THE EMBODIMENT(S)

The following description will describe embodiments and an example according to the present invention with reference to the drawings. It should be appreciated, however, that the embodiment and the example described below are illustrations of a semiconductor light emitting device and a light emitting apparatus to give a concrete form to technical ideas of the invention, and a semiconductor light emitting device and a light emitting apparatus of the invention are not specifically limited to description below. Additionally, the sizes and the positional relationships of the members in each of drawings are occasionally shown larger exaggeratingly for ease of explanation. Members same as or similar to those of this invention are attached with the same designation and the same reference signs, and their description is omitted. In addition, a plurality of structural elements of the present invention may be configured as a single part that serves the purpose of a plurality of elements, on the other hand, a single structural element may be configured as a plurality of parts that serve the purpose of a single element. Also, the description of some of examples or embodiments may be applied to other examples, embodiments or the like. Also, the term "on" (e.g., on a layer), or "on or above" (e.g., on or above a layer) used in the specification is not limited to the state where a member is formed in direct contact with a layer but occasionally includes the state where a member is formed upward with respect to a layer to be spaced away from the member, in other words, the state where a member is formed to interpose an intermediate member between the member and the layer in an inclusive sense. Also, in this specification, "configured for" includes meaning of "designed for," "made to," "constructed for," and so on.

FIRST EMBODIMENT

Figure 1:
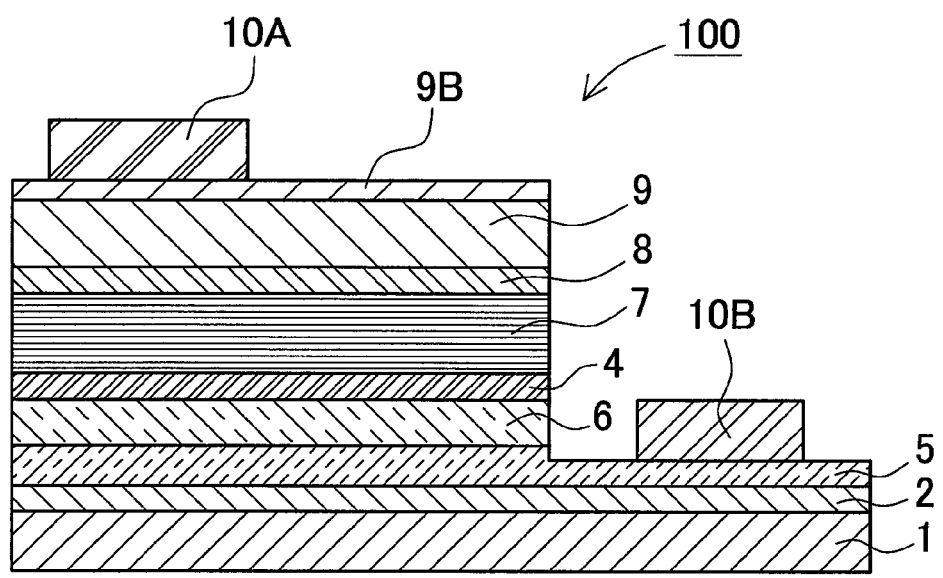
FIG. 1 is a schematic view showing the deposition structure of a semiconductor light emitting device according to one embodiment of the present invention.

FIG. 1 is a schematic view showing the deposition structure of a semiconductor light device 100 according to a first embodiment of the present invention. The semiconductor light emitting device 100 includes an AlGaN buffer layer 2, an n-type GaN contact layer 5, a lattice strain relief layer 6, an n-type GaN clad layer 4, an active layer 7, a p-type AlGaN clad layer 8, and a p-type GaN contact layer 9, which are deposited on or above a substrate 1 of sapphire in this order. A p-side electrode 10A is formed on the p-type GaN contact layer 9, while an n-side electrode 10B is formed on the n-type GaN contact layer 5. In addition, a transparent electrically conductive film 9B (for example, ITO, ZnO, etc.) can be formed on the entire upper surface of the p-type contact layer 9 between the p-side electrode 10a and the p-type contact layer 9. In this embodiment, the n-type GaN clad layer 4 and the n-type GaN contact layer 5 serve as a first conductive type semiconductor layer (n-type semiconductor layer), while the p-type GaN clad layer 8 and the p-type GaN contact layer 9 serve as a second conductive type semiconductor layer (p-type semiconductor layer).

(Lattice Strain Relief Layer 6)

The lattice strain relief layer 6 containing indium can be interposed between the n-type semiconductor layer and the active layer. The lattice strain relief layer 6 is constructed of a multilayer structure (e.g., superstructure) that includes first layers of Si-doped $In_{0.05}Ga_{0.95}N$ and second layers of GaN. For example, 30 pairs of first and second layers are repeatedly deposited on one after another. When the mixture ratio of In in the first layer of InGaN falls within the range of 0.02 to 0.3, the first layer can sufficiently serve as buffer layer. In the case where the lattice strain relief layer 6, which contains indium and serves as buffer layer, is interposed between the n-type semiconductor layer with good crystallinity and the active layer, the lattice strain relief layer can relieve a stress on the active layer, and avoid that an undesired stress is applied to the active layer. Alternatively, a non-doped single layer that contains indium and is deposited at temperature of 1000° C. may be used as the lattice strain relief layer 6. The non-doped single layer can also sufficiently serve as buffer layer. In addition, the lattice strain relief layer 6 may be doped with n-type impurities. In this case, the carrier injection efficiency and the amount of carriers can be increased. As a result, it facilitates to improve the light emission efficiency, and to lower Vf. In this case, when the lattice strain relief layer is doped with Si, the resistivity can be reduced. Accordingly, a buffer layer with low resistance can be formed.

(Active Layer 7)

The active layer 7 is constructed of a multi-quantum well structure or single quantum well structure that includes well and barrier layers 11 and 12. The well layer 11 and the barrier layer 12 are formed of a nitride semiconductor that contains at least In, and preferably $In_xGa_{1-x}N$ ($0 \leq x < 1$). The well and barrier layers 11 and 12 have different composition ratios of In so that the band gap of the well layer 11 is smaller than that of the barrier layer 12. Since the well and barrier layers 11 and 12 have different lattice constants, the difference between the lattice constants will produce the piezoelectric field in the boundary of the well layer 11 and the barrier layer 12. In order to avoid that the electrons and the positive holes are located apart from each other and to prevent reduction of the light emission recombination probability of the electrons and the positive holes, the well layer 11 has a gradient concentration of In from the negative side to the positive side of the piezoelectric field, which is produced in the well layer 11, along the deposition direction in this embodiment, for example.

Figure 2:
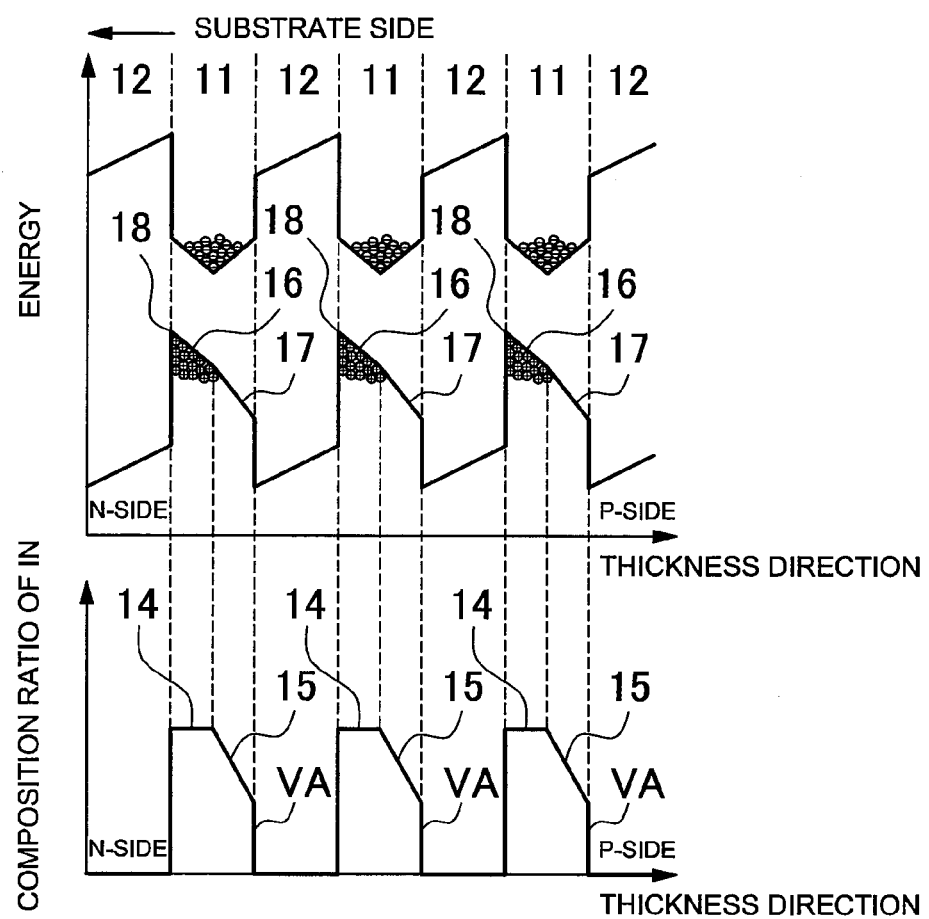
FIG. 2 shows the profile of composition ratio of In and the band profile of an active layer.
Figure 3:
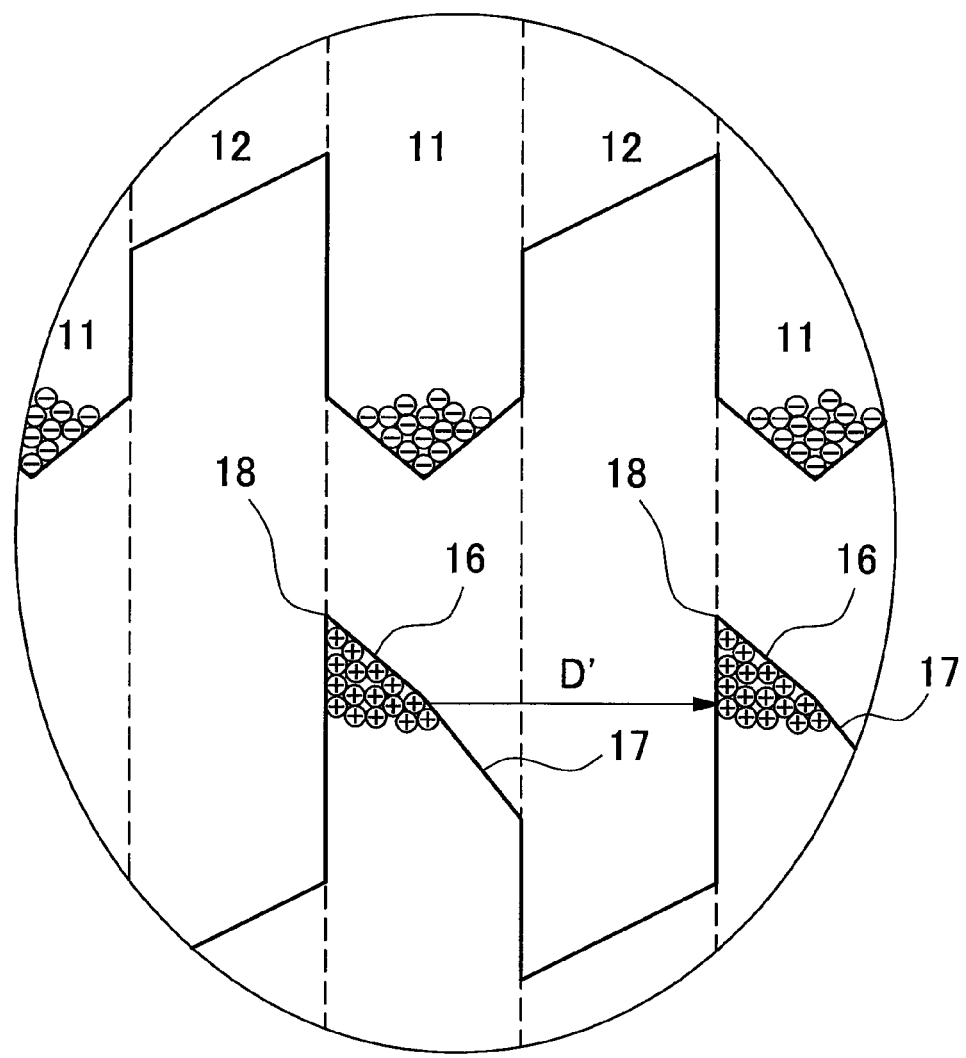
FIG. 3 is an enlarged view showing the essential part of the band profile shown in FIG. 2.

FIG. 2 shows the profile of composition ratio of In and the band profile. FIG. 3 shows an enlarged view of the band profile. As shown by the profile of composition ratio, the concentration of In is fixed in a first portion 14 that extends substantially one half of the thickness of the well layer from the substrate 1 side, while the concentration of In is reduced toward the side opposite to the substrate 1 in a second portion 15 that extends substantially another half of the thickness of the well layer, which is located on the side opposite to the substrate 1.

The band profile of the valence band of the well layer 11 includes a first profile portion 16 that slightly decreases from the substrate 1 side, and a second profile portion 17 that sharply decreases from the position corresponding to substantially one half of the thickness of the well layer 11. The positive holes in the valence band of the well layer 11 are distributed in a manner not concentrated around the deepest peak 18 of the well layer 11.

A shallow V-shaped part is created in the center of the conduction band of the well layer 11. The electrons can be extensively located along with the two sides that form the V-shaped part.

It is preferable that the thickness of the well layer fall within the range of 2 to 10 nm, more preferably of 2.5 to 5 nm.

The barrier layer is preferably formed of GaN. In addition, it is preferable that the thickness of the barrier layer fall within the range of 1 to 15 nm.

It is preferable that the concentration of In in the boundary between the well and barrier layers as the end surface of the second portion fall within the range of 40% to 60% of the concentration of In in the boundary between the barrier and well layers as the end surface of the first portion.

In the case where the concentration of In in the first portion 14 is substantially fixed as shown in FIG. 2, the first profile portion 16 can be created which slightly decreases from the substrate 1 side. Accordingly, the positive holes of the valence band can be extensively located in a certain thickness range of the well layer 11. According to this, it serves to avoid that the wave function of electrons shifts to one side while the wave function of positive holes shifts to another side, and that the electrons and the positive holes are spatially located apart from each other. Therefore, the recombination probability of the electrons and the positive holes can be improved. In addition, since the positive holes do not collect only around the peak 18 of the valence band. As a result, it facilitates to prevent increase of the probability of non-light-emission Auger recombination of the electrons and the positive holes. Since the positive holes can be extensively located in a certain thickness range of the well layer 11, the tunneling distance D' can be smaller as compared with the case where the positive holes collect around the peak 18. The tunneling distance is required for the positive holes to move between the well layers 11 adjacent to each other through the tunnel effect. Accordingly, reduction of carrier mobility can be suppressed. Therefore, the light emission efficiency can be improved.

Figure 4:
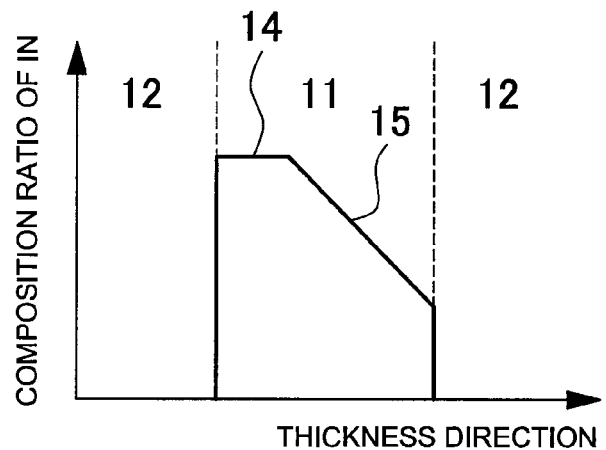
FIG. 4 is an enlarged view showing the profile of composition ratio of In in a well layer according to a modified embodiment.
Figure 5:
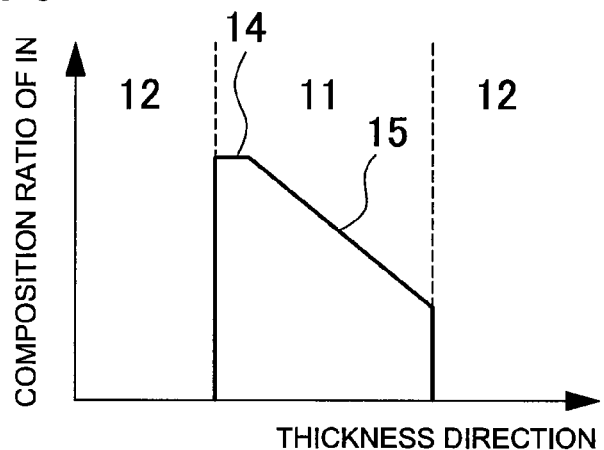
FIG. 5 is an enlarged view of the profile of composition ratio of In in a well layer according to another modified embodiment.

In the active layer 7, the thickness of the second portion 15 can be the same as or smaller than that of the first portion 14. Although the concentration of In in the well layer 11 is fixed in one half range from the substrate 1 side to the position corresponding to substantially one half of the thickness of the well layer (first portion 14), and is linearly reduced toward the side opposite to the substrate 1 in another half range with substantially one half of the thickness of the well layer on the side opposite to the substrate 1 side (second portion 15) in this embodiment shown in FIG. 2, the range with the fixed concentration of In in the well layer 11 (first portion 14) is not limited to substantially one half of the thickness of the well layer from the substrate 1 side. The range with the fixed concentration of In in the well layer (first portion 14) may be approximately one third of the thickness of the well layer from the substrate 1 side as in a modified embodiment shown in FIG. 4. Alternatively, the range with the fixed concentration of In in the well layer may be approximately 5% of the thickness of the well layer 11 from the substrate 1 side as in a modified embodiment shown in FIG. 5. Furthermore, the range with the fixed concentration of In in the well layer may be more than one half of the thickness of the well layer from the substrate 1 side. When the range with the fixed concentration of In (the first portion 14) is wide, the tunneling distance can be smaller in which the positive holes are required to move between the well layers through the tunnel effect. Accordingly, the positive holes can more smoothly move between the well layers. Therefore, reduction of carrier mobility can be suppressed.

As shown in FIG. 2, the profile of concentration of In in the well layer, which includes the first and second portions, preferably has a vertical area VA in the boundary between the well layer and the barrier layer, which is the end surface of the second portion. In other words, it is preferable that In be included in the end surface of the second portion on the barrier layer side. In the case where this vertical area VA extends higher, the gradient of the second profile portion 17 from the first profile portion 16 can be smaller. Thus, the range can be larger in which the positive holes be extensively located. Accordingly, the range can be larger in which the wave functions of the positive holes of the valence band overlap the wave functions of the electrons of the conduction band. As a result, the recombination probability can be improved. Therefore, the light emission efficiency can be improved. Specifically, it is preferable that the height of the vertical area VA as the right end of the second portion be approximately 40% to 60% of the left end of the second portion having the highest concentration of In. In other words, it is preferable that the concentration of In included in the end surface of the second portion on the barrier layer side be 40% to 60% of the concentration of In included in the end surface of the first portion on the barrier layer side. In this case, the range can be larger in which the positive holes overlap the electrons. Accordingly, it facilitates to prevent increase of the probability of non-light-emission Auger recombination. Therefore, reduction of the light output can be avoided.

Figure 6:
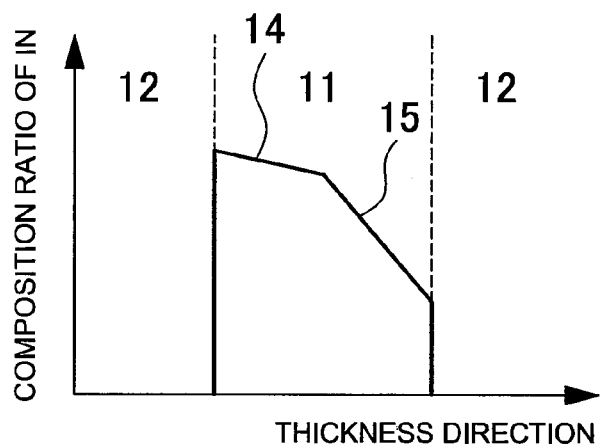
FIG. 6 is an enlarged view of the profile of composition ratio of In in a well layer according to another modified embodiment.

Although it has been described that the concentration of In is fixed in a certain range of each of the well layers 11 on the substrate 1 side in the embodiments, the present invention is not limited to this. For example, as in a modified embodiment shown in FIG. 6, the concentration of In in the first portion 14 may be reduced toward the side opposite to the substrate 1 as long as the composition ratio of In in the second portion 15 is more sharply reduced as compared with the first portion 14. The gradient of the first profile portion 16 of the band profile can be adjusted to any angle by adjusting the gradient of the profile of composition ratio of In in the first portion 14.

Figure 7:
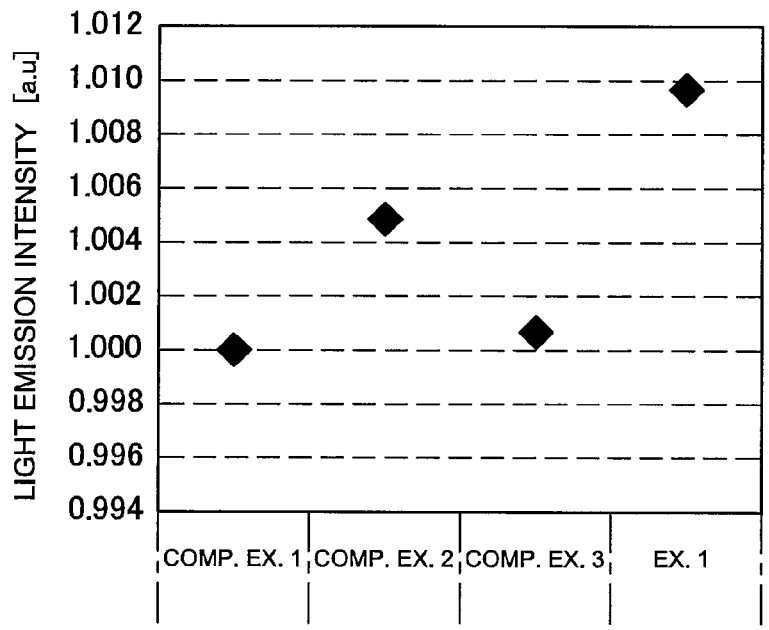
FIG. 7 is a graph showing the result obtained by measurement of light emission intensities where semiconductor light emitting devices according to an example and comparative examples are driven at 80 mA.
Figure 8:
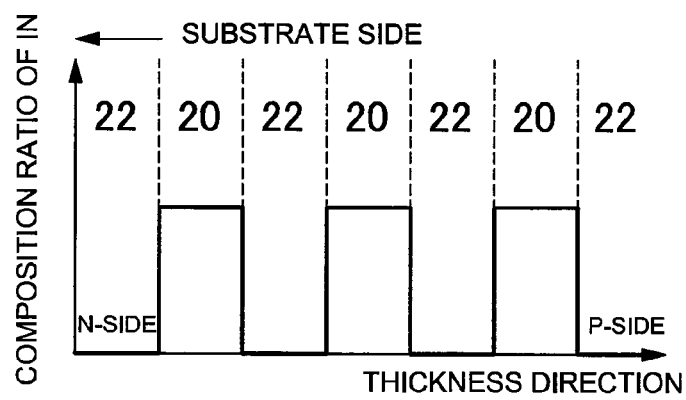
FIG. 8 is a diagram showing the profile of composition ratio of In in an active layer of a semiconductor light emitting device according to comparative example 1.
Figure 9:
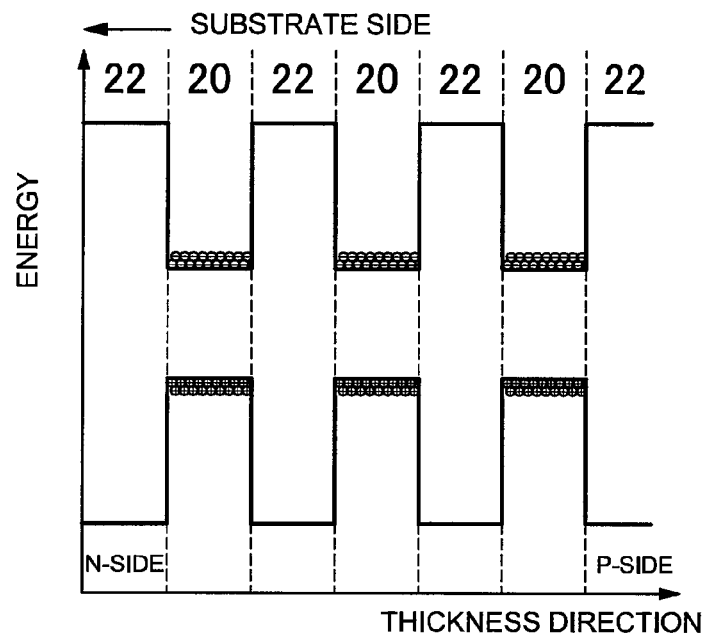
FIG. 9 is a diagram showing the band profile where the piezoelectric field does not produce the distortion.
Figure 11:
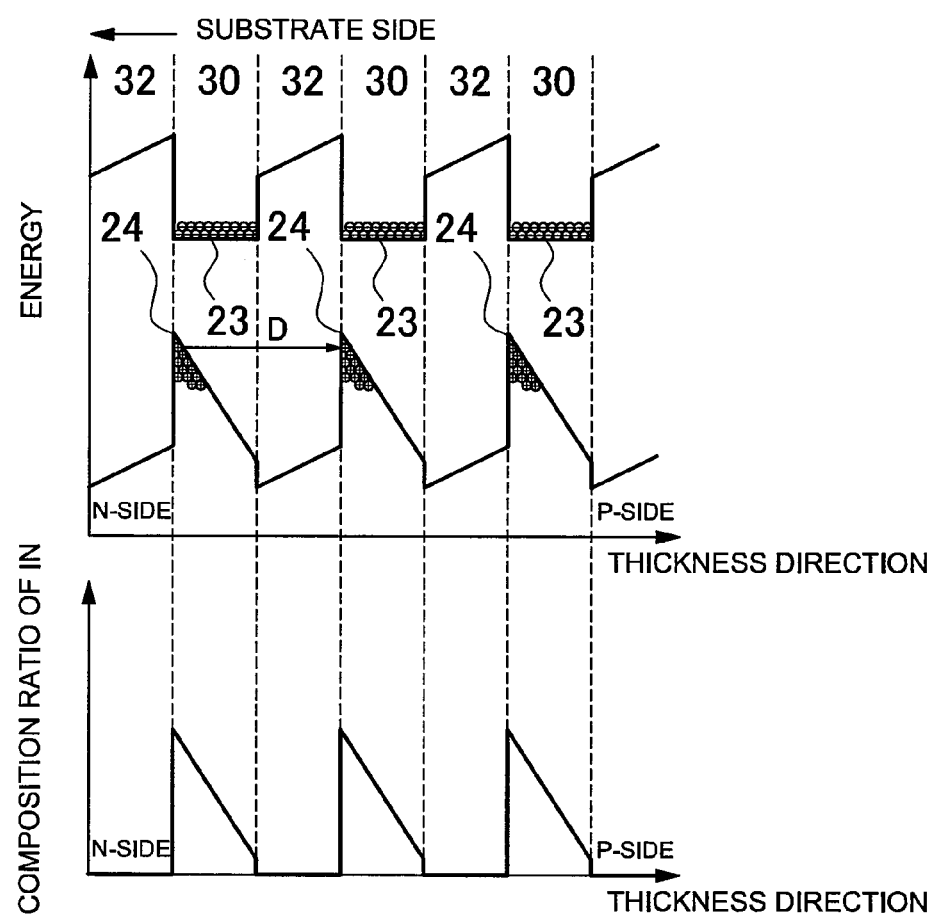
FIG. 11 is a diagram showing the profile of composition ratio of In and the band profile of an active layer of a semiconductor light emitting device according to comparative example 2.
Figure 12:
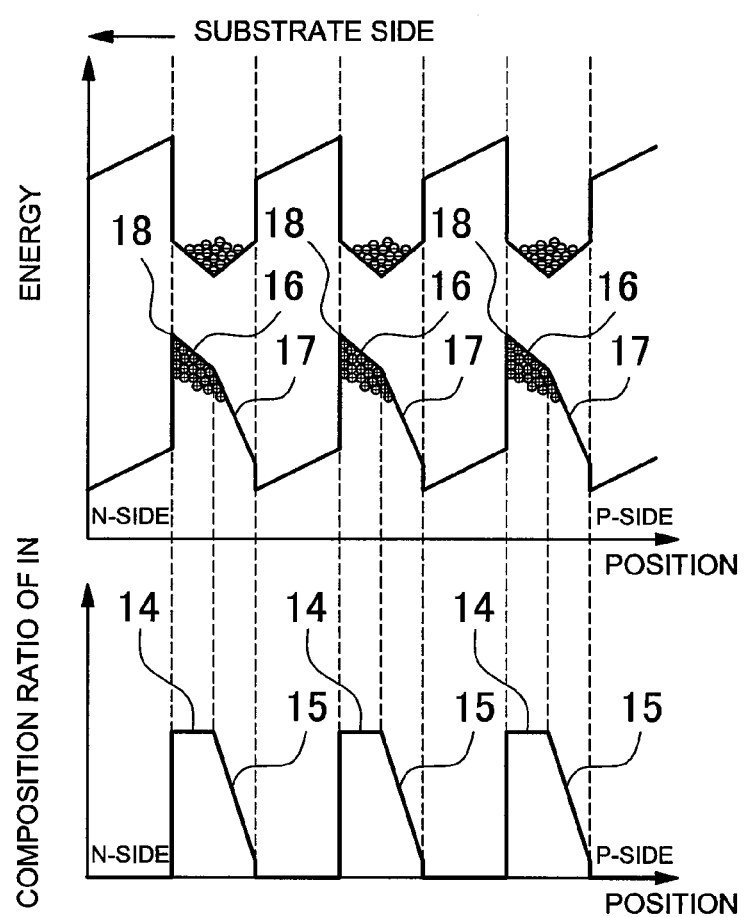
FIG. 12 is a diagram showing the band profile of well layers of a semiconductor light emitting device according to a comparative example 3.
Figure 13:
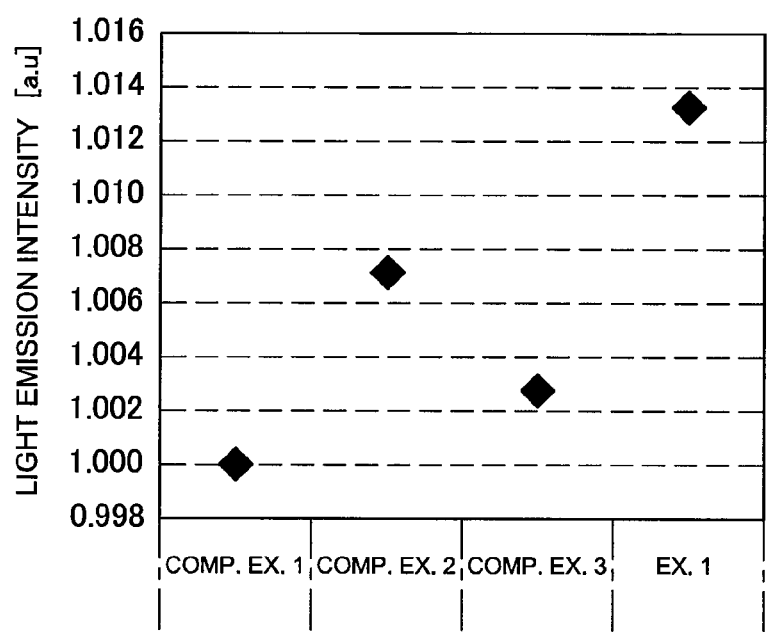
FIG. 13 is a graph showing the result obtained by measurement of light emission intensities where semiconductor light devices according to the example and comparative examples are driven at 120 mA.

FIGS. 7 and 13 show the results obtained by measurement of light emission intensities where semiconductor light devices according to an example and comparative examples are driven at 80 and 120 mA, respectively. The semiconductor light emitting device 100 having the profile of composition ratio of In shown in FIG. 2 is formed as an example 1. The thickness of the AlGaN buffer layer 2 is approximately 15 nm. The thickness of the n-type GaN contact layer 5 is approximately 9000 nm. The total thickness of the lattice strain relief layer 6 is approximately 60 nm (20 pairs of GaN with thickness of approximately 2 nm and InGaN with thickness of approximately 1 nm). The thickness of the n-type GaN clad layer 4 is approximately 5 nm. The total thickness of the active layer 7 is approximately 63 nm (nine pairs of GaN with thickness of approximately 4 nm and InGaN with thickness of approximately 3 nm and gradient concentration of In ranging from approximately 15% to 8%). The thickness of the p-type AlGaN clad layer 8 is approximately 15 nm. The thickness of the p-type GaN contact layer 9 is approximately 70 nm. Also, a semiconductor light emitting device is formed as a comparative example 1 which has a profile of composition ratio of In in which the concentration of In is fixed along the deposition direction of the well and barrier layers 20 and 22 (see FIG. 8). Also, a semiconductor light emitting device is formed as a comparative example 2 which has a profile of composition ratio of In in which the concentration of In is linearly reduced from the substrate side to the side opposite to the substrate (see FIG. 11). In addition, a semiconductor light emitting device is formed as a comparative example 3 which has a profile of composition ratio of In in which the concentration of In is flat from the first portion to the midpoint of the well layer and is reduced from the midpoint to a value close to zero at the boundary between the well layer and the barrier layer as shown in FIG. 12.

Figure 10:
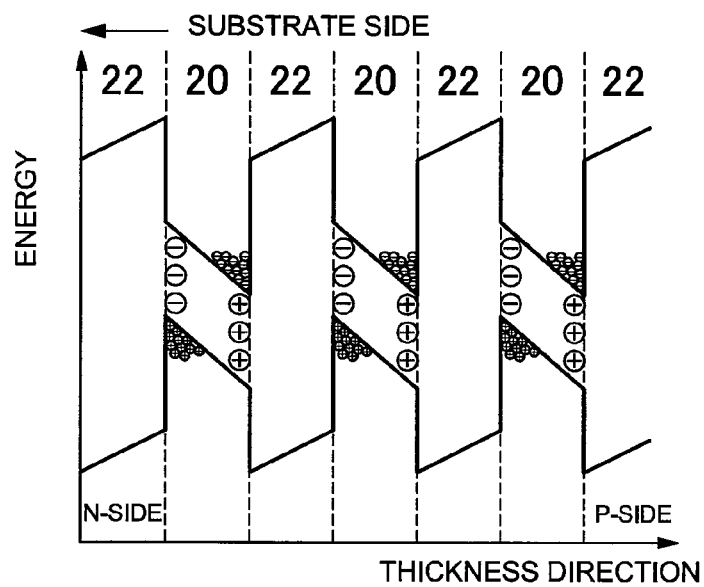
FIG. 10 is a diagram showing the band profile where the piezoelectric field produces the distortion.

In the semiconductor light emitting device according to the comparative example 1, the negative polarization charge will be produced on the substrate side of each of the well layers 20, while the positive polarization charge will be produced on the side opposite to the substrate side of each of the well layers 20. Due to the polarization charge, the energy of the conduction band and the valence band of the well layer 20 on the substrate side of the becomes high, while the energy of the conduction band and the valence band on the side opposite to the substrate becomes low (see FIG. 10). The positive holes in the valence band collect around the peak of the valence band. For this reason, the probability of non-light-emission Auger recombination will be increased. Thus, the electrons collect on the side of the well layer 20 opposite to the substrate side, while the positive holes collect on the substrate side of the well layer 20. Since the electrons and the positive holes are located apart from each other, the recombination probability of the electrons and the positive holes is low. In addition, since the positive holes collect around the peak of the valence band, the tunneling distance is increased in which the positive holes are required to move between well layers 20 adjacent to each other through the tunnel effect. Accordingly, the carrier mobility is reduced.

The composition ratio of In in a well layer 30 is linearly reduced from the substrate side toward the side opposite to the substrate in the semiconductor light emitting device according to the comparative example 2. In this comparative example, although the electrons be uniformly located along the thickness direction of the well layer 30 in the conduction band, which will have a flat profile of composition ratio of In, the positive holes collect around the peak of the valence band on the substrate side (see FIG. 11). For this reason, the probability of non-light-emission Auger recombination will be increased. Also, the recombination probability of the electrons and the positive holes will be reduced. In addition, since the positive holes collect around the peak of the valence band, the tunneling distance D is increased in which the positive holes are required to move between well layers adjacent to each other through the tunnel effect. Accordingly, the hole mobility is reduced.

The light emission intensity in the comparative example 3 is lower than the comparative examples 1 and 2 at driving current of 80 mA as shown in FIG. 7. The light emission intensity in the comparative example 3 is slightly higher than the comparative example 1 but still lower than the comparative example 2 at driving current of 120 mA as shown in FIG. 13. The reason can be conceived that the concentration of In is sharply reduced to a value close to zero at the boundary between the well layer and the barrier layer in the comparative example 3 as shown in FIG. 12 so that the positive holes of the valence band is likely to collect on the substrate side (left side in FIG. 12) of the well layer while the electrons of the electric conduction band collect around the center of the well layer, which in turn reduces the recombination probability because the positive holes will not overlap the electrons as discussed above whereby increasing the probability of non-light-emission Auger recombination. In addition, the tunneling distance D will be long in which the positive holes are required to move between well layers adjacent to each other. From this viewpoint, it can be considered that the mobility of the positive holes is low.

As shown in FIG. 7, as compared with the comparative example 1 in which the well layer does not have a gradient composition ratio of In, that is, the concentration of In in the well layer is fixed, the light emission intensities in the comparative example 2 and the example 1 are high in which the well layer has a gradient composition ratio of In. In comparison with the comparative example 2 in which the well layer 30 has a linear gradient composition ratio of In along the entire thickness direction of the well layer, the light emission intensity in the example 1 is higher than the comparative example 2. In the example 1, the well layer has a sharp gradient composition ratio of In from the midpoint in the thickness direction of the well layer 11. The reason can be conceived that the positive holes of the valence band of the well layer 11 do not collect only around the highest point of the well layer 11 but be extensively located from the point, which in turn can increase the recombination probability of the electrons and the holes while suppressing the probability of non-light-emission Auger recombination. Another reason can be conceived that the tunneling distance D' is short in which the positive holes are required to move between well layers through the tunnel effect.

In the case where the composition ratio of In has a linear gradient along the entire thickness direction of the well layer 30 as in the comparative example 2, similar to the case where the barrier layer 32 is increased from viewpoint of the positive holes, the tunneling distance will be increased in which the positive holes are required to move between well layers 30 through the tunnel effect. For this reason, it can be considered that the carrier mobility is reduced. Also, it can be considered that the positive holes collect around the highest point of the well layer 30, which in turn will increase the probability of non-light-emission Auger recombination. From this viewpoint, the light emission intensity cannot be improved.

As discussed above, it can be found that the gradient of the concentration profile of In composition have an influence on the light emission intensity. In particular, it is found that the light emission intensity tends to increase in the case where the well layer has a gradient of composition ratio of In only in a part of its entire thickness (e.g., one half of the entire thickness) as compared with the case where the well layer has a gradient of composition ratio of In in its entire thickness. According to this finding, it can be believed that the distributions of the carriers overlap each other so that the light emission recombination probability is improved. Also, in the case where the well layer has a gradient composition ratio of In along the entire thickness direction of the well layer, similar to the case where the barrier layer is increased from viewpoint of the positive holes, it can be considered that the positive holes collect around the highest point of the well layer, which in turn will increase the probability of non-light-emission Auger recombination, and will disturb the movement of the positive holes between the well layers. From this viewpoint, in this case, the light emission intensity is reduced. According to the results, it can be confirmed that, in the case where the well layer includes a portion without gradient composition ratio of In along its thickness direction, these adverse effects are avoided so that the light emission intensity is improved.

A semiconductor light emitting device according to the present invention can be applied to a light source for backlighting, a light source for lighting, a headlight, a display that includes light emitting devices as light sources arranged in a matrix shape, a traffic light, an illuminated switch, various sensors such as image scanner, and various indicators, and the like.

It should be apparent to those with an ordinary skill in the art that while various preferred embodiments of the invention have been shown and described, it is contemplated that the invention is not limited to the particular embodiments disclosed, which are deemed to be merely illustrative of the inventive concepts and should not be interpreted as limiting the scope of the invention, and which are suitable for all modifications and changes falling within the scope of the invention as defined in the appended claims. The present application is based on Application No. 2013-174,035 filed in Japan on Aug. 24, 2013, the content of which is incorporated herein by reference.

What is claimed is:

1. A semiconductor light emitting device comprising an active layer that includes a well layer and a barrier layer, wherein said well layer is formed of a gallium nitride group semiconductor that contains In, wherein the well layer has a profile of a composition ratio of indium that includes a first portion, a second portion that continues immediately from said first portion, a third portion that continues immediately from said second portion, and a fourth portion that continues immediately from said third portion, wherein, in a thickness direction of the well layer from a negative side to a positive side of a piezoelectric field that is produced in the well layer, (i) the first portion of the profile is substantially vertical, (ii) the second portion of the profile is substantially linear and extends in a direction transverse to a vertical direction, and a concentration of indium in said second portion is substantially fixed or decreases, (iii) the third portion of the profile is substantially linear, and a concentration of indium in said third portion smoothly decreases, and (iv) the fourth portion of the profile is substantially vertical.

2. A semiconductor light emitting device comprising:
an n-type semiconductor layer;
an active layer that includes a well layer and a barrier layer; and
a p-type semiconductor layer, wherein said n-type semiconductor layer, said active layer and said p-type semiconductor layer are deposited on or above one another in this order, wherein said well layer is formed of a gallium nitride group semiconductor that contains indium,
wherein the well layer has a profile of a composition ratio of indium that includes a first portion, a second portion that continues immediately from said first portion, a third portion that continues immediately from said second portion, and a fourth portion that continues immediately from said third portion,
wherein, in a thickness direction of the well layer from a negative side to a positive side of a piezoelectric field that is produced in the well layer, (i) the first portion of the profile is substantially vertical, (ii) the second portion of the profile is substantially linear and extends in a direction transverse to a vertical direction, and a concentration of indium in said second portion is substantially fixed or decreases, (iii) the third portion of the profile is substantially linear, and a concentration of indium in said third portion smoothly decreases, and (iv) the fourth portion of the profile is substantially vertical.

3. The semiconductor light emitting device according to claim 1, wherein the concentration of indium in said second portion is substantially fixed.

4. The semiconductor light emitting device according to claim 1, wherein a thickness of said third portion is the same as or smaller than that of said second portion.

5. The semiconductor light emitting device according to claim 1, wherein the third portion contains indium on its end surface on a barrier layer side of the active layer.

6. The semiconductor light emitting device according to claim 5, wherein a concentration of indium that is contained in the end surface of said third portion on the barrier layer side falls within the range of 40% to 60% of a concentration of indium that is contained in an end surface of said second portion on the barrier layer side.

7. The semiconductor light emitting device according to claim 1, wherein a thickness of the said well layer falls within the range of 2 to 10 nm.

8. The semiconductor light emitting device according to claim 1, wherein a thickness of said barrier layer falls within the range of 1 to 15 nm.

9. The semiconductor light emitting device according to claim 1, wherein said barrier layer is formed of GaN.

10. The semiconductor light emitting device according to claim 2, wherein the concentration of indium in said second portion decreases in the thickness direction of said well layer from the n-type semiconductor side to the p-type semiconductor side of the semiconductor light emitting device.

11. The semiconductor light emitting device according to claim 1,
wherein a band energy profile of a valence band of the well layer includes a first energy profile corresponding to said second portion of the composition ratio of In, and a second energy profile corresponding to said third portion of the composition ratio of In, and
wherein, in the thickness direction of said well layer from the negative side to the positive side of the piezoelectric field that is produced in said well layer, said second energy profile decreases at a greater rate than that of said first energy profile.

12. The semiconductor light emitting device according to claim 1, wherein a band energy profile of a conduction band of the well layer is formed in a V-shape.

13. The semiconductor light emitting device according to claim 1, wherein said well layer is formed of $In_xGa_{1-x}N$ ($0 \leq x < 1$).

14. The semiconductor light emitting device according to claim 2, wherein a thickness of said third portion is the same as or smaller than a thickness of said second portion.

15. The semiconductor light emitting device according to claim 2, wherein the third portion contains indium on its end surface on a barrier layer side of the active layer.

16. The semiconductor light emitting device according to claim 15, wherein a concentration of indium that is contained in the end surface of said third portion on the barrier layer side falls within the range of 40% to 60% of a concentration of indium that is contained in an end surface of said second portion on the barrier layer side.

17. The semiconductor light emitting device according to claim 2, wherein said well layer is formed of $In_xGa_{1-x}N$ ($0 \leq x < 1$).

* * * * *